（12）United States Patent
Carralero et al.

(10) Patent No.: US 8,494,312 B2
(45) Date of Patent: Jul. 23, 2013

(54) MAGNETICALLY ACTUATED PHOTONIC CRYSTAL SENSOR

(75) Inventors: Michael A. Carralero, Huntington Beach, CA (US); Olav Solgaard, Stanford, CA (US); Ty A. Larsen, Everett, WA (US)

(73) Assignee: The Boeing Company, Chicago, IL (US)

( * ) Notice: Subject to any disclaimer, the term of this patent is extended or adjusted under 35 U.S.C. 154(b) by 297 days.

(21) Appl. No.: 12/859,255

(22) Filed: Aug. 18, 2010

(65) Prior Publication Data

US 2012/0045165 A1    Feb. 23, 2012

(51) Int. Cl.
*G02F 1/295*    (2006.01)
*G02B 6/00*    (2006.01)
*G02B 26/00*    (2006.01)

(52) U.S. Cl.
USPC .................. 385/6; 385/13; 359/290; 359/298

(58) Field of Classification Search
USPC ............................................................ 385/6
See application file for complete search history.

(56) References Cited

U.S. PATENT DOCUMENTS

2006/0257067 A1    11/2006  Bratkovski et al.

FOREIGN PATENT DOCUMENTS

EP           1555552 A2     7/2005
WO    WO2009156410 A1    12/2009

OTHER PUBLICATIONS

International Search Report and Written Opinion of the International Searching Authority mailed on Jan. 19, 2012 for PCT Application No. PCT/US2011/044401 filed on Jul. 18, 2011—International Searching Authority—European Patent Office.
S. Hadzialic, S. Kim, A.S. Sudbo, O. Solgaard, "Two-dimensional photonic crystals fabricated in monolithic single-crystal silicon", IEEE Photonics Technology Letters, vol. 22, No. 2, pp. 67-69, Jan. 15, 2010.
I.W. Jung, S. Kim, O. Solgaard, "High-Reflectivity Broadband Photonic Crystal Mirror MEMS Scanner With Low Dependence on Incident Angle and Polarization," Journal of Microelectromechanical Systems, vol. 18, No. 4, pp. 924-932, Aug. 2009.
I.-W. Jung, B. Park, J. Provine, R.T. Howe, O. Solgaard, "Photonic Crystal Fiber Tip Sensor for Precision Temperature Sensing," IEEE Lasers and Electro-Optics Society (LEOS) Annual Meeting, pp. 761-762, Belek-Antalya, Turkey, Oct. 4-8, 2009.
I.-W. Jung, B. Park, J. Provine, R.T. Howe, O. Solgaard, "Monolithic Silicon Photonic Crystal Slab Fiber Tip Sensor", 2009 IEEE/LEOS International Conference on Optical MEMS and Nanophotonics, pp. 19-20, Clearwater Beach, Florida, Aug. 17-20, 2009.
S. Basu Mallick, S. Kim, S. Hadzialic, A. Sudbø, O. Solgaard, "Double-layered Monolithic Silicon Photonic Crystals," Conference on Lasers and Electro-Optics (CLEO) 2008, Paper CThCC7, San Jose, CA, May 4-9, 2008.
O. Kilic, M. Digonnet, G. Kino, O. Solgaard, "External fibre Fabry—Perot acoustic sensor based on a photonic-crystal mirror," IOP Publishing Measurement Science and Technology, vol. 18, No. 12, pp. 3049-3054, Sep. 2007.

*Primary Examiner* — Jerry Rahll
(74) *Attorney, Agent, or Firm* — Ameh IP; Lowell Campbell; Elahe Toosi

(57) ABSTRACT

A magnetically actuated photonic crystal sensor is disclosed. An optical fiber comprises at least one photonic crystal means coupled to a first end thereof, and a magnetic material coupled to the at least one photonic crystal means.

9 Claims, 10 Drawing Sheets

MAGNETICALLY ACTUATED PHOTONIC CRYSTAL SENSOR

FIELD

Embodiments of the present disclosure relate generally to sensors. More particularly, embodiments of the present disclosure relate to magnetic sensors.

BACKGROUND

Optical sensing systems and methods are highly desirable due to their inherent Electromagnetic Interference (EMI) and High Intensity Radiated Field (HIRF) immunity. Optical sensing designs aimed at applications such as structural health monitoring currently involve placing optical sensors in direct contact with an environment or object to be sensed. Some sensing applications such as proximity sensing may currently require use of light emission and detection, direct physical contact, or direct physical obstruction by optical sensing systems and methods in order to function optimally. In at least such applications, current optical sensing systems and methods may generally have low reliability in an environment comprising obscurants, obstructions, debris, and potential for physical deformation.

SUMMARY

A magnetically actuated photonic crystal sensor is disclosed. An optical fiber comprises a photonic crystal coupled to a first end thereof, and a magnetic material coupled to the photonic crystal.

In a first embodiment, a magnetically actuated photonic crystal sensor comprises an optical fiber comprising a first end. At least one photonic crystal means is coupled to the first end, and at least one magnetic material is coupled to the at least one photonic crystal means.

In a second embodiment, a method for using a magnetically actuated photonic crystal sensor system comprises receiving a received magnetic force on a magnetic material coupled to a photonic crystal such that the photonic crystal is actuated by the received magnetic force. The method further transmits a transmitted light through an optical fiber to the photonic crystal. The method then receives a reflected light through the optical fiber from the photonic crystal. The method further determines a determined difference in the reflected light from the transmitted light.

In a third embodiment, a method provides a magnetically actuated photonic crystal sensor. The method provides a photonic crystal and couples the photonic crystal to a first end of an optical fiber. The method then couples a magnetic material to the photonic crystal.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF DRAWINGS

A more complete understanding of embodiments of the present disclosure may be derived by referring to the detailed description and claims when considered in conjunction with the following figures, wherein like reference numbers refer to similar elements throughout the figures. The figures are provided to facilitate understanding of the disclosure without limiting the breadth, scope, scale, or applicability of the disclosure. The drawings are not necessarily made to scale.

DETAILED DESCRIPTION

The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. Furthermore, there is no intention to be bound by any expressed or implied theory presented in the preceding field, background, summary or the following detailed description. The present disclosure should be accorded scope consistent with the claims, and not limited to the examples described and shown herein.

Embodiments of the disclosure may be described herein in terms of functional and/or logical block components and various processing steps. It should be appreciated that such block components may be realized by any number of hardware, software, and/or firmware components configured to perform the specified functions. For the sake of brevity, conventional techniques and components related to manufacturing, optical sensing, magnetic sensing, and other functional aspects of the systems (and the individual operating components of the systems) may not be described in detail herein. In addition, those skilled in the art will appreciate that embodiments of the present disclosure may be practiced in conjunction with a variety of structural bodies, and that the embodiments described herein are merely example embodiments of the disclosure.

Embodiments of the disclosure are described herein in the context of a practical non-limiting application, namely, accelerometers and sensing an open or closed state of a door such as an aircraft door. Embodiments of the disclosure, however, are not limited to such aircraft door and accelerometer applications, and the techniques described herein may also be utilized in other sensor applications. For example, embodiments may be applicable to light switches, lock latches, collision control devices, position of aircraft control surfaces, position of landing gear, power line voltage, power line current, and the like.

As would be apparent to one of ordinary skill in the art after reading this description, the following are examples and embodiments of the disclosure and are not limited to operating in accordance with these examples. Other embodiments may be utilized and structural changes may be made without departing from the scope of the exemplary embodiments of the present disclosure.

Figure 1:
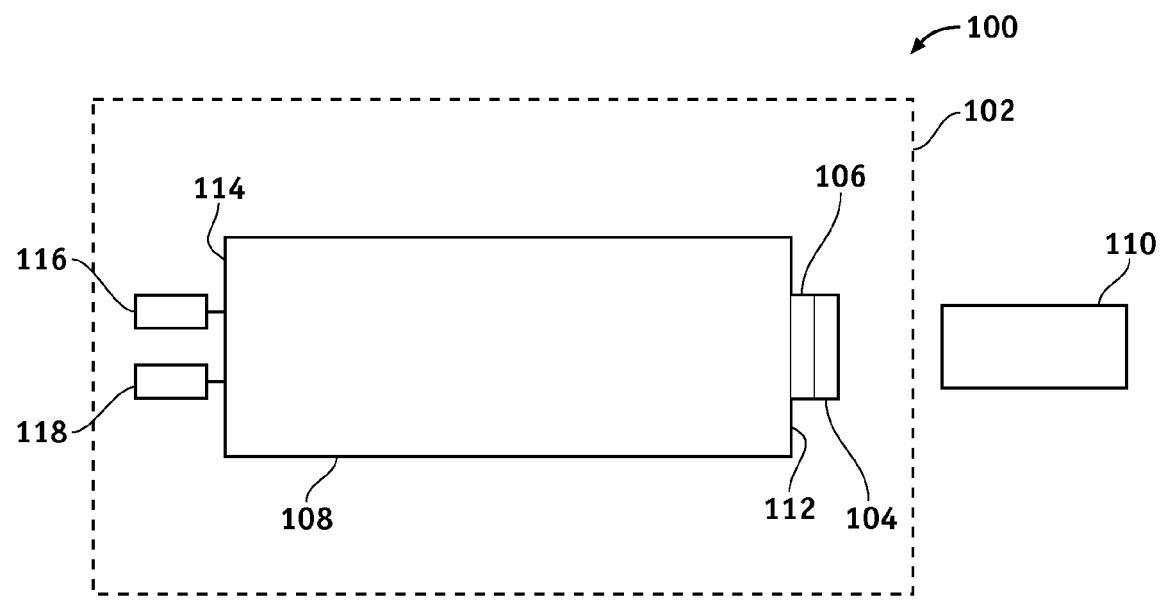
FIG. 1 is an illustration of an exemplary magnetically actuated photonic crystal sensor system according to an embodiment of the disclosure.

FIG. 1 is an illustration of an exemplary magnetically actuated photonic crystal sensor system 100 (system 100) according to an embodiment of the disclosure. The system 100 uses magnetic fields to apply forces to a magnetic material without requiring any physical contact thereon. The magnetic material in turn actuates a photonic crystal that is sensed by a laser. The system 100 may comprise a magnetically actuated photonic crystal sensor 102 and a target 110.

The magnetically actuated photonic crystal sensor 102 comprises a magnetic material 104, a photonic crystal 106, and an optical fiber 108.

The magnetic material 104 is configured to sense, for example but without limitation, presence, absence, motion, acceleration or displacement of the target 110. The magnetic material 104 may comprise any of various types of magnetic material, for example but without limitation, Ferrous, Ceramic, Alnico, Samarium Cobalt, Neodymium Iron Boron, mixtures thereof, and the like.

The photonic crystal 106 is configured to be sensitive to forces and is mechanically coupled to the magnetic material 104. The photonic crystal 106 is also coupled to a first end 112 of the optical fiber 108. The photonic crystal 106 is formed from, for example but without limitation, a silicon crystal base as explained in more detail below. Photonic crystals are periodic optical nanostructures that are designed to affect a motion of photons in a similar manner to how periodicity of a semiconductor crystal affects a motion of electrons. In this manner, a periodic optical nanostructure of the photonic crystal 106 may comprise, for example but without limitation, a lattice of optical holes, a lattice of optical beads, and the like. Photonic crystals comprise periodic dielectric or metallo-dielectric nanostructures that affect a propagation of electromagnetic waves. The propagation of the electromagnetic waves is affected in a similar manner to a periodic potential in a semiconductor crystal affecting an electron motion by defining allowed and forbidden electronic energy bands. Photonic crystals may contain regularly repeating internal regions or periodic structures of high and low dielectric constant. The periodic structures of photonic crystals may be used to provide optical properties comprising, for example but without limitation, inhibition of spontaneous emission, high-reflectivity omni-directional mirrors, low-loss-waveguides, and the like. In this manner, the photonic crystal 106 reflects a sensing light at a respective frequency.

Photons of light behaving as waves may propagate through the periodic structures depending on their wavelength. Wavelengths of light that are allowed to travel in a photonic crystal are known as allowed modes, groups of allowed modes are known as bands, and disallowed bands of wavelengths are known as photonic band gaps. To provide the optical properties mentioned above, the periodicity of the periodic structures of the photonic crystals should be substantially of a same length-scale as half the wavelength of the electromagnetic waves. In particular, the repeating regions of high and low dielectric constant of the periodic structure should be substantially of an order of a half the wavelength of the electromagnetic waves. For example, the repeating regions of high and low dielectric constants of the periodic structure should be approximately 200 nm (blue) to approximately 350 nm (red) for photonic crystals operating in a visible part of the electromagnetic spectrum.

Figure 2:
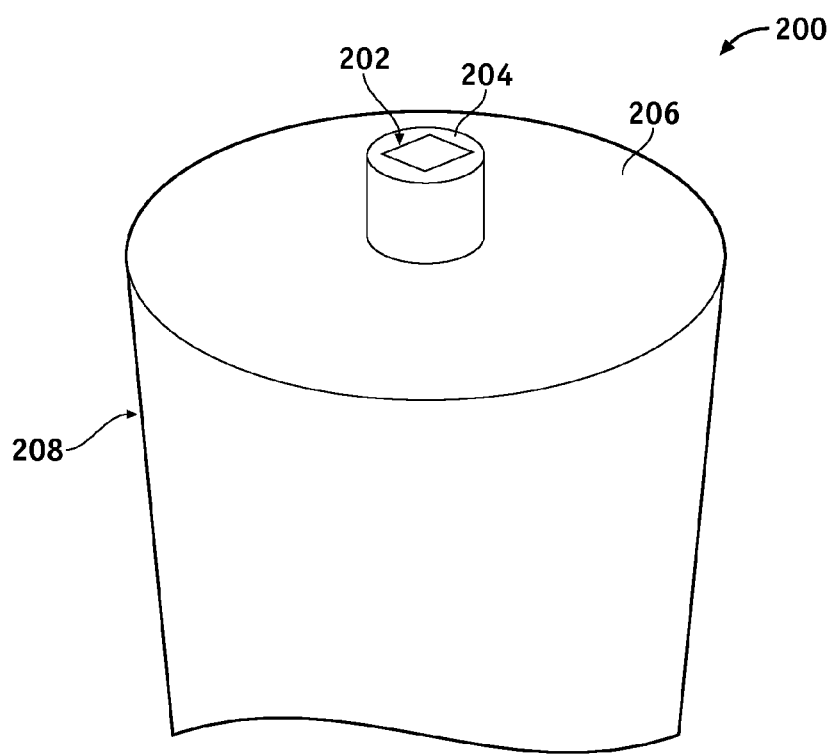
FIG. 2 is an illustration of an exemplary magnetically actuated photonic crystal sensor showing a photonic crystal installed on a tip of an optical fiber according to an embodiment of the disclosure.

The optical fiber 108 is configured to carry light to and from the photonic crystal 106. The optical fiber 108 is protected from moisture, deformation, and the like, by a fiber coating 208 (FIG. 2). At least one light source 116 such as at least one coherent light source 116 is coupled to a second end 114 of the optical fiber 108 to send a coherent light beam through the optical fiber 108 to the photonic crystal 106. The at least one light source 116, is not limited to a coherent light source, and may comprise, for example but without limitation, a semi-coherent light source, a non-coherent light source, and the like. The at least one light source 116, and the at least one coherent light source 116 are used interchangeably herein. Additionally, at least one light detector 118 is coupled to the second end 114 of the optical fiber 108 to receive reflected light from the photonic crystal 106. Light is retained in the core of the optical fiber 108 by internal reflection, causing the optical fiber 108 to act as a waveguide. Fibers that support many propagation paths or transverse modes are called multi-mode fibers, while those that can only support a single mode are called single-mode fibers. Multi-mode fibers generally have a larger core diameter (e.g., $\geq 50$ μm) than a core of a single-mode fiber, and are generally used for short-distance communication links and applications where high power may be transmitted. The larger core diameter of the multi-mode optical fiber may allow lower precision and lower cost transmitters and detectors to be used as well as lower cost connectors. However, a multi-mode fiber may introduce modal dispersion, which may limit a bandwidth and length of a link. Furthermore, because of its higher dopant content, multi-mode fibers generally exhibit higher attenuation than single mode fiber. Single-mode fibers are generally used for communication links longer than about 550 meters. A core of a single-mode fiber is generally smaller (e.g., <10 µm) than a core of a multi-mode fiber and may allow longer and higher-performance links than a multi-mode fiber.

The target 110 (magnetically detectable object 110) is configured to be sensed by the magnetic material 104. The target 110 may comprise, for example but without limitation, an object whose motion is to be sensed, a tag placed on an object whose motion is to be sensed, a door structure, and the like. The target 110 may comprise, for example but without limitation, a magnetic material, a ferrous material, an induced magnetic material (e.g., induced magnetism in aluminum), a diamagnetic material, and the like. To improve detection, the target 110 may comprise a multi-element target, for example but without limitation, a ferrous center with a magnetic outer ring, a "strip" with alternating magnetic fields, and the like. With the ferrous center with the magnetic outer ring, a high deflection of the magnetic material 104 may occur as the sensor nears the magnetic outer ring, with a sudden attraction as of the magnetic material 104 reaches the ferrous center. With the strip with alternating magnetic fields, the magnetic material 104 would oscillate as it moves over the strip.

If the target 110 is a magnetic target, depending on a pole arrangement of the magnetic target, a force in a desired direction can be induced on the photonic crystal 106 in response to motion of the target 110. A force induced on the photonic crystal 106 causes optical changes in the system 100. If the target 110 is a ferrous target, an attraction of the magnetic material 104 to the ferrous target can cause the photonic crystal 106 to induce an optical change such as a multi-wavelength interferometric change. In this manner, a motion of the target 110 can be sensed and measured accordingly. For example, if the target 110 comprises a cargo door, then closure of the cargo door may be sensed by motion induced in the photonic crystal 106.

For cargo doors, current technology requires an inductive coil for a current sensor and a piece of steel (e.g., a coupon with bolt holes) as a target on the cargo door. The cargo door is usually aluminum and therefore the current sensor only interacts with that coupon. Current is driven through the inductive coil and a change is detected as the target moves into range. For the target 110 instead of the inductive coil, a relatively small magnetically actuated photonic crystal sensor such as the sensor 102 can be used. As a ferrous or magnetic target moves in range, it causes deflections of the magnetic material 104 and thus the photonic crystal 106.

FIG. 2 is an illustration of an exemplary magnetically actuated photonic crystal sensor 200 (i.e., 102 in FIG. 1 without the magnetic material 104) showing a photonic crystal 202 installed on a first end 112/206 of an optical fiber 108/206 coated by a fiber coating 208 according to an embodiment of the disclosure.

Figure 3:
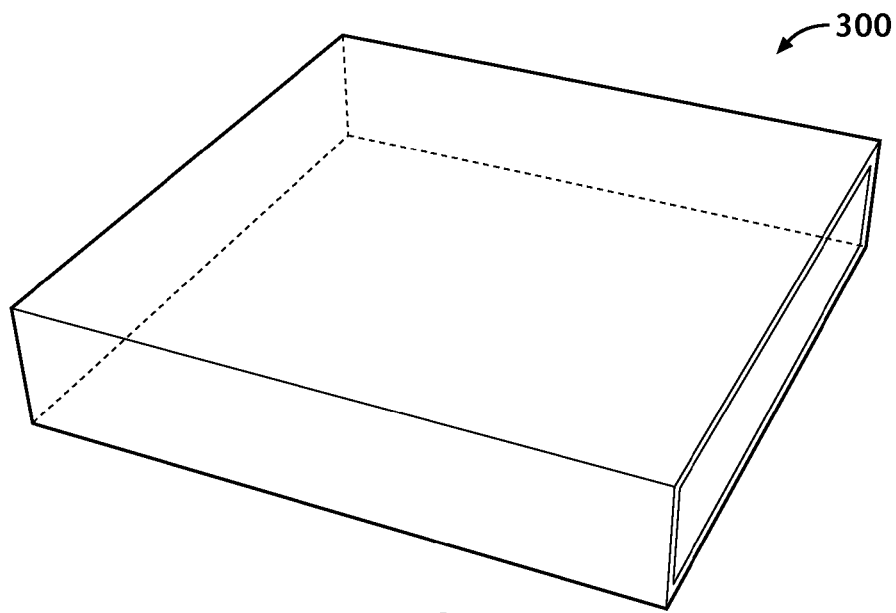
FIG. 3 is an illustration of an exemplary silicon crystal base according to an embodiment of the disclosure.

FIG. 3 is an illustration of an exemplary silicon crystal base according to an embodiment of the disclosure. The silicon crystal base 300 may comprise any dielectric material, such as but without limitation, an optical quality silicon having a "transparency" wave length of about 1.3 µm to 1.6 µm (e.g., silicon, doped silicon), and the like. Doping may be used to determine optical qualities of the silicon. Other materials, such as but without limitation, gallium arsenide, indium gallium phosphide, copper indium gallium (di) selenide (CIGS), silicon carbide, diamond, silicon oxide, and the like, may be also be used.

Figure 4:
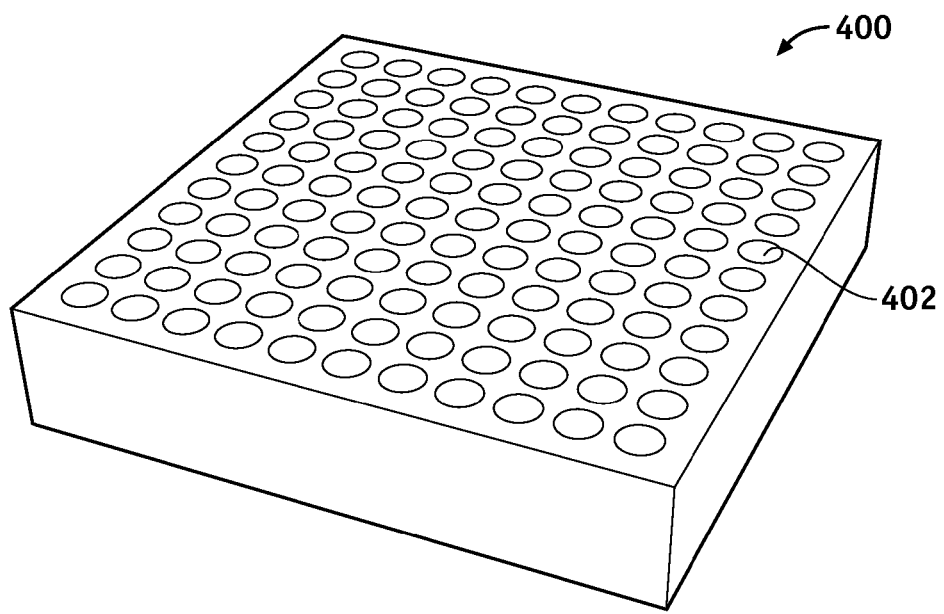
FIG. 4 is an illustration of an exemplary photonic crystal lattice comprising a plurality of etched holes according to an embodiment of the disclosure.

FIG. 4 is an illustration of an exemplary photonic crystal lattice 400 formed by the silicon crystal base 300 comprising a plurality of etched holes according to an embodiment of the disclosure. Etching is used to create the holes 402 in a material. Spacing and size of the holes 402 creates the photonic crystal lattice 400. Diameters of the holes 402 may be, for example but without limitation, about 0.25 µm to about 1.0 µm.

Figure 5:
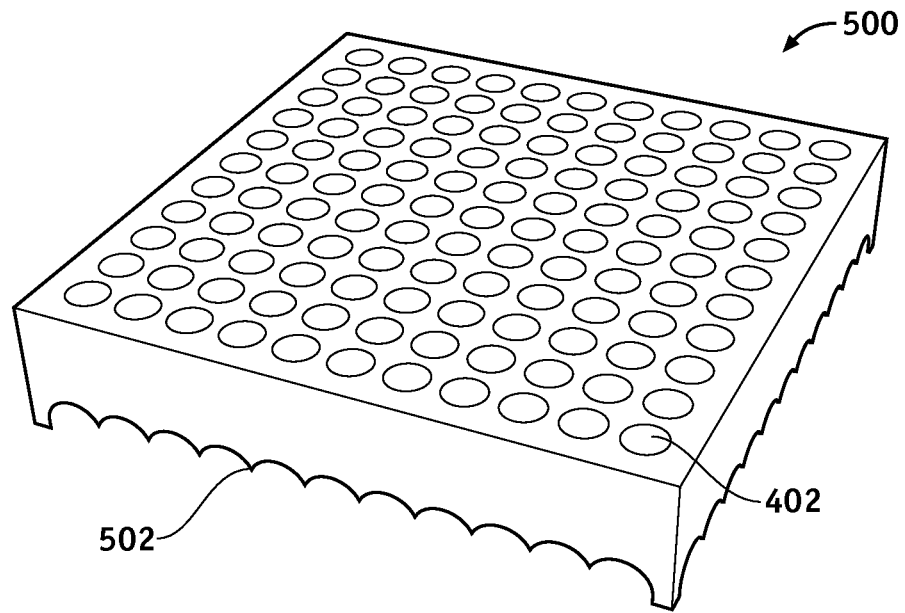
FIG. 5 is an illustration of an exemplary photonic crystal comprising a plurality of etched holes separated from a substrate to form a photonic crystal lattice according to an embodiment of the disclosure.

FIG. 5 is an illustration of an exemplary photonic crystal 500 comprising a plurality of etched holes 402 separated from a substrate (not shown) to form a photonic crystal lattice such as the photonic crystal 106/202 according to an embodiment of the disclosure. A substantially large amount of etching at a bottom 502 of the holes 402 substantially removes the base material from which the photonic crystal 106/202 is formed, thereby allowing the photonic crystal 500 to be separated from the base material and used as the photonic crystal 106/202 in the magnetically actuated photonic crystal system 100.

Figure 6:
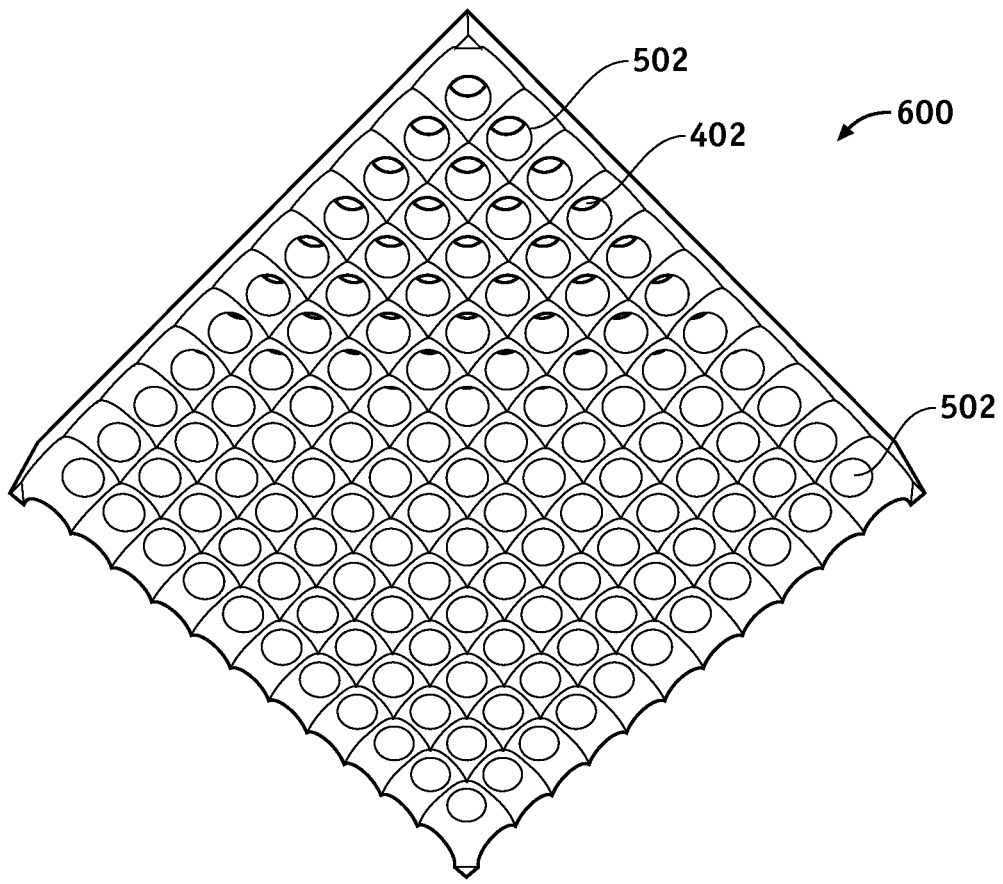
FIG. 6 is an illustration of a perspective bottom view of the photonic crystal shown in FIG. 5 according to an embodiment of the disclosure.

FIG. 6 is an illustration of a perspective bottom view 600 of the photonic crystal 500 according to an embodiment of the disclosure. The bottom view 600 illustrates how etching can be used to separate the photonic crystal 106/202 from the base material from which the photonic crystal 106/202 is formed.

Figure 7:
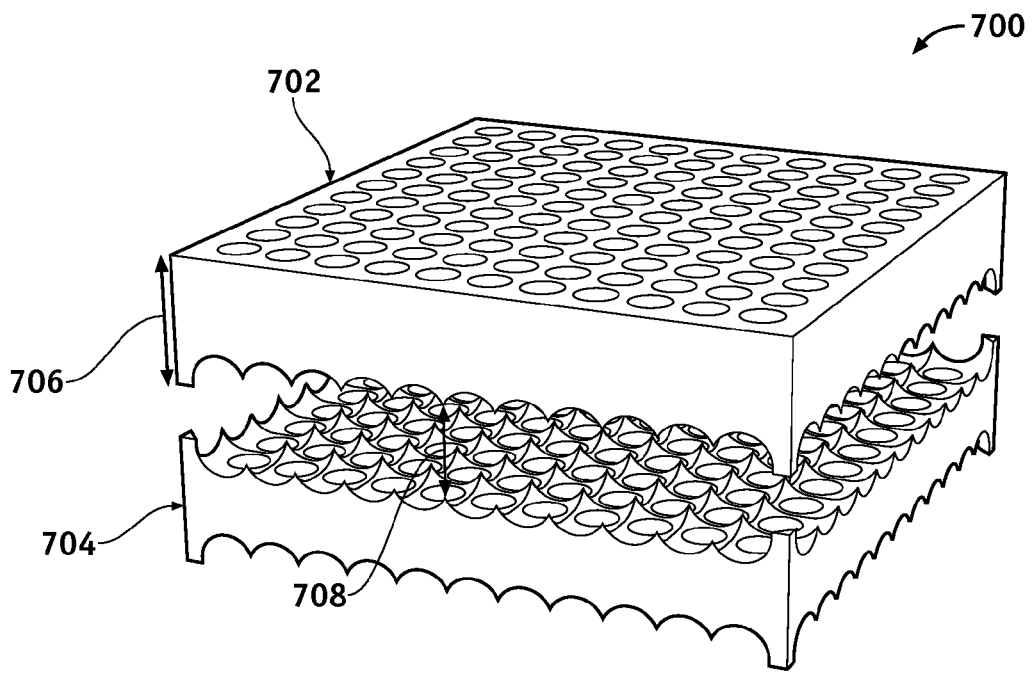
FIG. 7 is an illustration of an exemplary multi-layer Fabry-Perot (etalon) Interferometer formed from two photonic crystals according to an embodiment of the disclosure.

FIG. 7 is an illustration of an exemplary multi-layer Fabry-Perot (etalon) Interferometer 700 formed from two photonic crystals 702 and 704 (500 in FIG. 5) according to an embodiment of the disclosure. In the embodiment shown in FIG. 7, the photonic crystals 702 and 704 are placed substantially parallel to each other. Thickness 706 of each of the photonic crystals 702 and 704 may be, for example but without limitation, about 400 µm to about 500 µm, and the like. The photonic crystals 702 and 704 may be separated by, for example but without limitation, about 1.0 µm, and the like. In this manner, substantially minor changes in any one of the photonic crystals 702 and 704 can create interference patterns needed for sensing applications. An amount of light reflection depends on the separation distance 708. The photonic crystals 702 and 704 form the multi-layer Fabry-Perot (etalon) Interferometer 700.

Interferometers generally use light or another form of electromagnetic wave for Interferometry. Interferometry is a technique for determining properties of two or more waves by measuring an interference pattern created by a superposition of the two or more waves. Interferometry makes use of a principle of superposition to combine separate waves together to cause a result of the combination to have a property that may be used to measure an original state of the two or more waves. When two waves with a substantially equal frequency combine, a resulting interference pattern may be determined by a phase difference between the two waves (i.e., in phase waves constructively interfere and out-of-phase waves destructively interfere). Interference fringes between two coherent beams can be used to determine a motion of the photonic crystals 702 and 704, and thereby measure a motion of the magnetic material 104 caused by the target 110.

In optics, a Fabry-Pérot interferometer or etalon is typically made of a transparent plate with two reflecting surfaces such as the photonic crystals 702 and 704, or two parallel highly reflecting mirrors. The former is an etalon and the latter is an interferometer, but the terminology may be used interchangeably. A transmission spectrum as a function of wavelength exhibits peaks of large transmission corresponding to resonances of the etalon.

A varying transmission function of an etalon is caused by interference between the multiple reflections of light between the two reflecting surfaces such as the photonic crystals 702 and 704. Constructive interference occurs if the transmitted beams are in phase, which corresponds to a high-transmission peak of the etalon. If the transmitted beams are out-of-phase, destructive interference occurs, which corresponds to a transmission minimum.

For example, a single incoming beam of coherent light can be split into two beams by a grating or a partial mirror. Each of the two beams travel a different route (path) until recombined before arriving at a detector. A path difference in a distance traveled by each beam can create a phase difference between the two beams. The phase difference creates an interference pattern between waves of the two beams. If a single beam has been split along two paths then a phase difference can be used to measure any parameter that changes the phase along the two paths. For example but without limitation, a physical change in a path length, a change in a refractive index along one or more of the two paths, and the like. The changes provide means for measuring a motion of the magnetic material 104.

For another example, in homodyne detection, interference occurs between two beams at a substantially same wavelength. A phase difference between the two beams results in a change in an intensity of the light on the detector. Changes in the intensity can be used for measuring a motion of the photonic crystals 702 and 704 and thus measure a motion of the magnetic material 104.

For another example, in heterodyne detection, one of two beams is modulated (e.g., by a frequency shift) prior to detection. In optical heterodyne detection, an interference of the two beams can be detected as a beat frequency. The modulated beam may comprise a signal oscillated between minimum and maximum levels for every cycle of the beat frequency. Since a modulation of the modulated beam is known, a relative phase of a measured beat frequency can be measured substantially precisely even if an intensity level of each of the two beams is drifting. Changes in the relative phase can be used for measuring a motion of the photonic crystals 702 and 704 and thus measure a motion of the magnetic material 104.

By measuring a motion of the photonic crystals 702 and 704, a motion of the target 110 is sensed via the magnetic material 104. Measurement of the motion of the photonic crystals 702 and 704, allows determination of the motion of the target 110. For example but without limitation, velocity, displacement, deceleration, acceleration and the like of the photonic crystals 702 and 704, may be used to determine the motion of the target 110.

Figure 8:
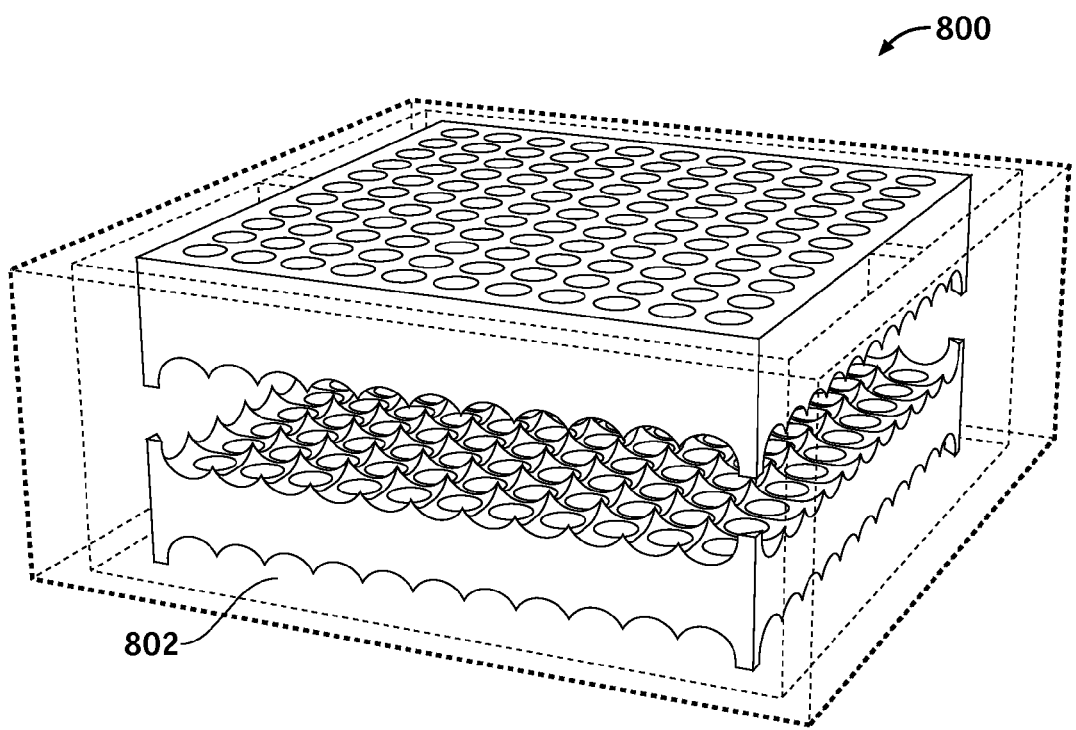
FIG. 8 is an illustration of an exemplary multi-layer Fabry-Perot (etalon) Interferometer coupled to a Micro-Electro-Mechanical System (MEMS) frame according to an embodiment of the disclosure.

FIG. 8 is an illustration of an exemplary multi-layer Fabry-Perot (etalon) Interferometer 800 coupled to a Micro-Electro-Mechanical System (MEMS) frame according to an embodiment of the disclosure. FIG. 8 shows a representation of how a sensor using the multi-layer Fabry-Perot (etalon) Interferometer 800 might be formed in a traditional etching process. Magnetic particles can be introduced into such a construction in order to allow the sensor to sense presence or absence of a target material (magnetic or ferrous/permeable). In the embodiment shown in FIG. 8, application of the target material to the multi-layer Fabry-Perot (etalon) Interferometer 800 allows detection of the presence or the absence of the target martial. Additionally, it may be possible for the sensor to act as an accelerometer in some cases depending on construction, creating a multi-functional sensor.

Figure 9:
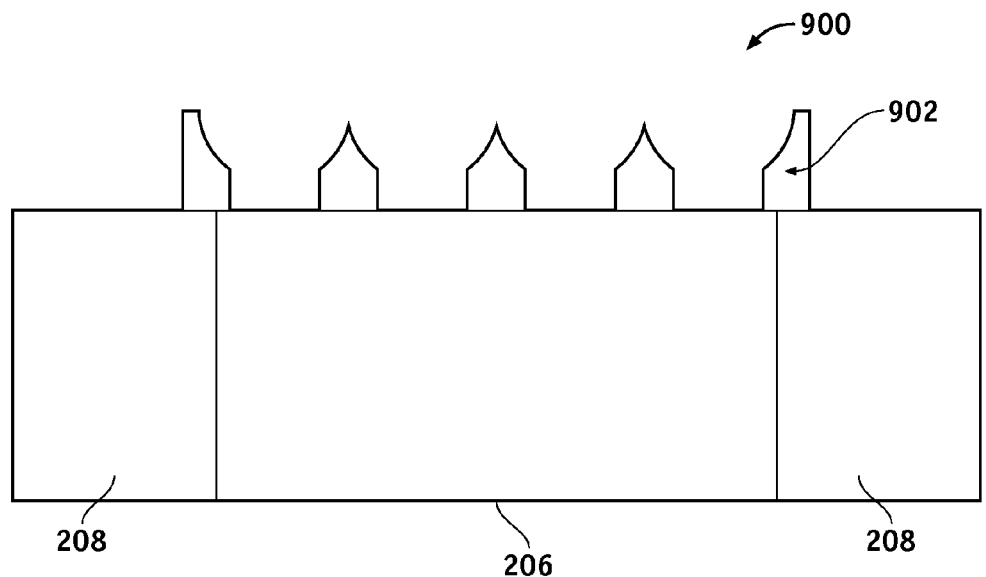
FIG. 9 is an illustration of an exemplary multifunction photonic crystal sensor according to an embodiment of the disclosure.

FIG. 9 is an illustration of an exemplary multifunction photonic crystal sensor 900 according to an embodiment of the disclosure. The multifunction photonic crystal sensor 900 comprises a multifunction photonic crystal 902 mounted on the optical fiber 206 coated by the fiber coating 208. The multifunction photonic crystal 902 comprises 2 and 3-dimensional structures that may be used with 2 or 3 magnets (not shown) to detect forces in 2 and 3-dimensions respectively. In order to measure each function of the multifunction photonic crystal 902, a laser light comprising two or more frequencies are used to interrogate the multifunction photonic crystal 902. Each of the two or more frequencies measure one of the functions of the multifunction photonic crystal 902, and two or more light detectors (not shown) are used to receive the two or more frequencies. The optical fiber 206 may comprise, for example but without limitation, a single-mode fiber, a multi-mode fiber, and the like, operable to transmit the two or more frequencies. The multifunction photonic crystal 902 may be used for, for example but without limitation, accelerometers, torque meters, and the like.

Figure 10:
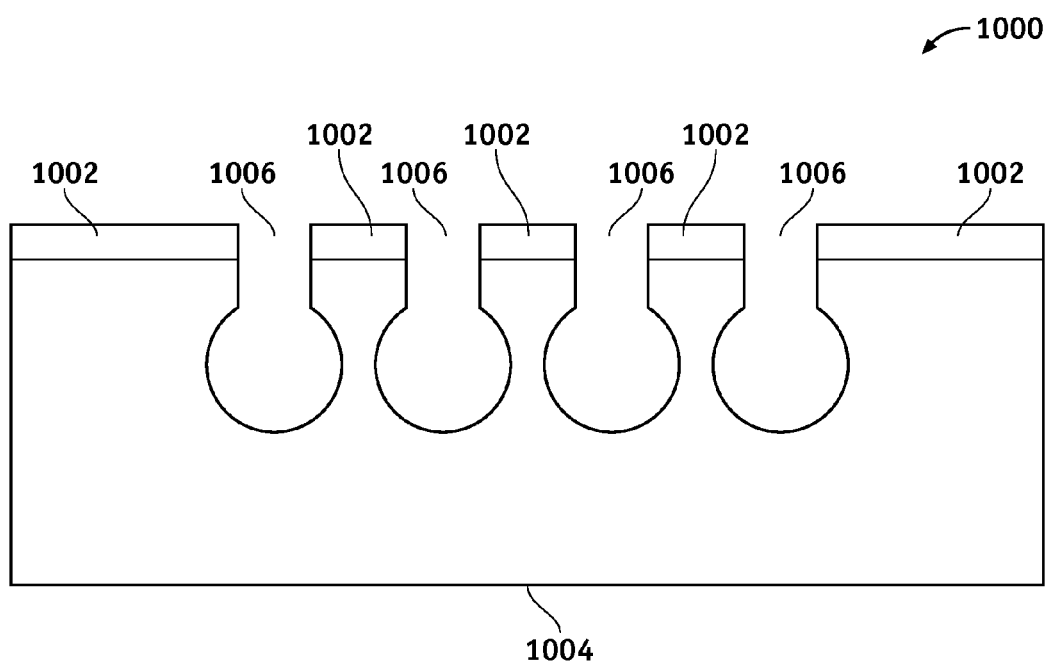
FIG. 10 is an illustration of a result of a patterning step, a directional etching step, a first oxide-etching step, and a release-etching step in a process for forming a multifunction magnetically actuated photonic crystal sensor according to an embodiment of the disclosure.

FIG. 10 is an illustration of a photonic crystal work-piece result 1000 of a patterning step, a directional etching step, a first oxide-etching step, and a release-etching step in a process for forming a multifunction magnetically actuated photonic crystal sensor 1500 (FIG. 15) according to an embodiment of the disclosure.

In the patterning step, a pattern mask 1002 is formed on a silicon base 1004. The pattern mask 1002 comprises a lattice pattern (not shown) for forming a lattice of holes 1006. The lattice of holes 1006 may comprise, for example but without limitation, a rectangular lattice, a hexagonal lattice, and the like. The lattice of holes 1006 may comprise, for example but without limitation, cylindrical holes, spheroidal holes, and the like. The lattice of holes 1006 may be formed by, for example but without limitation, directional etching, anisotropic etching, laser ablation, and the like.

In the directional etching step, the lattice of holes 1006 is covered with an open bottom sidewall mask 1104, and the lattice of holes 1006 is filled with an optical silicon material to form spherical holes 1102. The optical silicon material may comprise, for example but without limitation, polysilicon, and the like.

In the first oxide-etching step, the pattern mask 1002 (FIG. 11), the open bottom sidewall mask 1104 (FIG. 11), are removed via, for example but without limitation, oxide etching, a solvent based removal process, and the like.

In the release-etching step, excess base material 1304 is removed by, for example but without limitation, oxide etching, a solvent based removal process, abrasion, and the like.

Figure 11:
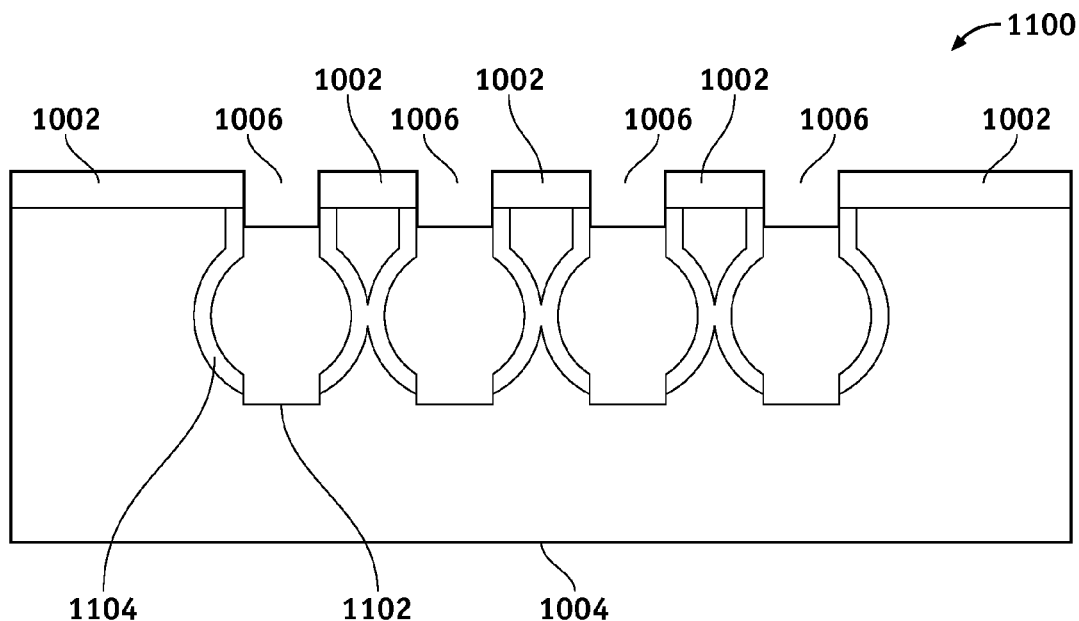
FIG. 11 is an illustration of a result of an oxide deposition step and a polysilicon deposition step in a process for forming a multifunction magnetically actuated photonic crystal sensor according to an embodiment of the disclosure.

FIG. 11 is an illustration of a photonic crystal work-piece result 1100 of an oxide deposition step and a polysilicon deposition step in a process for forming a multifunction magnetically actuated photonic crystal sensor 1500 according to an embodiment of the disclosure.

In the oxide deposition step, a silicon dioxide, or a similar film is deposited or grown conformally on substantially all silicon surfaces. The deposited oxide is removed from horizontal surfaces by directional etching.

In the polysilicon deposition step, polysilicon or a similar material is deposited conformally on the photonic crystal work-piece result 1000, and then etched or polished back until the polysilicon fills the lattice of holes 1006, but does not cover a front surface (not shown).

Figure 12:
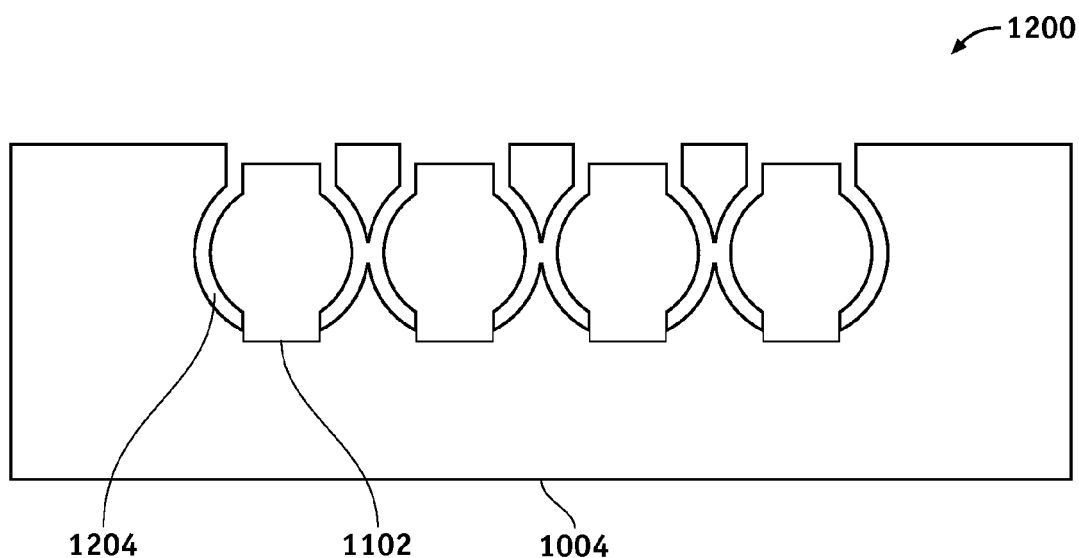
FIG. 12 is an illustration of a second oxide-etching step in a process for forming a multifunction magnetically actuated photonic crystal sensor according to an embodiment of the disclosure.

FIG. 12 is an illustration of a second oxide-etching step 1200 in a process for forming a multifunction magnetically actuated photonic crystal sensor 1500 according to an embodiment of the disclosure. The masking layer and the oxide separating the polysilicon from the substrate are removed in an isotropic etch.

Figure 13:
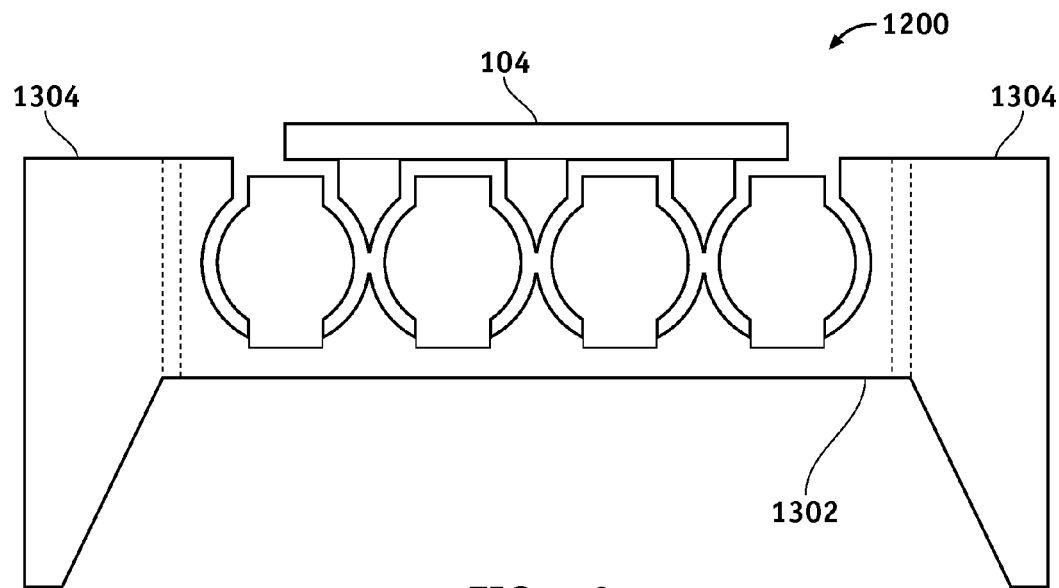
FIG. 13 is an illustration of a silicon-etching step, a backside silicon-etching step, and a magnet-mounting step in a process for forming a multifunction magnetically actuated photonic crystal sensor according to an embodiment of the disclosure.

FIG. 13 is an illustration of a result 1300 of a silicon-etching step, a backside silicon-etching step, and a magnet-mounting step in a process for forming a multifunction magnetically actuated photonic crystal sensor 1500 according to an embodiment of the disclosure.

In the silicon-etching step, the silicon is etched from the front (not shown) to form the desired mechanical structures that allow the multifunction photonic crystal 1302 to move in response to magnetic forces and to allow release of the magnetically actuated photonic crystal sensor 1500 before mounting on the optical fiber 206.

In the backside silicon-etching step, the silicon substrate is etched from the back 1306 of the silicon base 1004 to partially release the magnetically actuated photonic crystal sensor 1500 from the substrate.

In the magnet-mounting step, the magnetic material 104 is mounted on the multifunction photonic crystal 1302.

Figure 14:
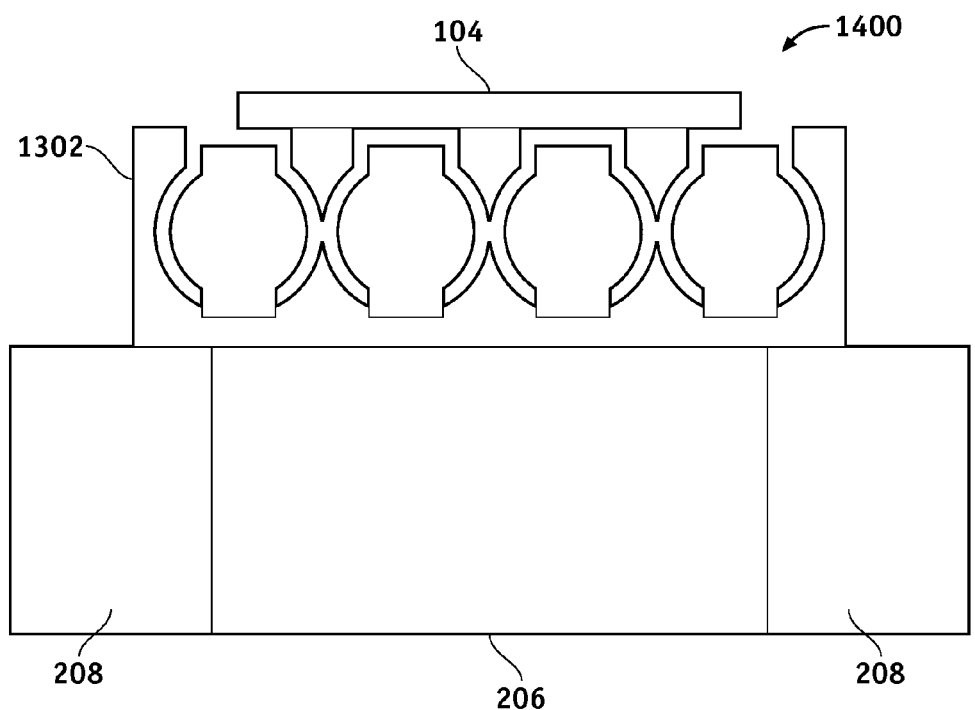
FIG. 14 is an illustration of a fiber-mounting step in a process for forming a multifunction magnetically actuated photonic crystal sensor according to an embodiment of the disclosure.

FIG. 14 is an illustration of a fiber-mounting step 1400 in a process for forming the multifunction magnetically actuated photonic crystal sensor 1500 according to an embodiment of the disclosure. The magnetic material 104 and the multifunction photonic crystal 1302 are mounted on the optical fiber 206.

Figure 15:
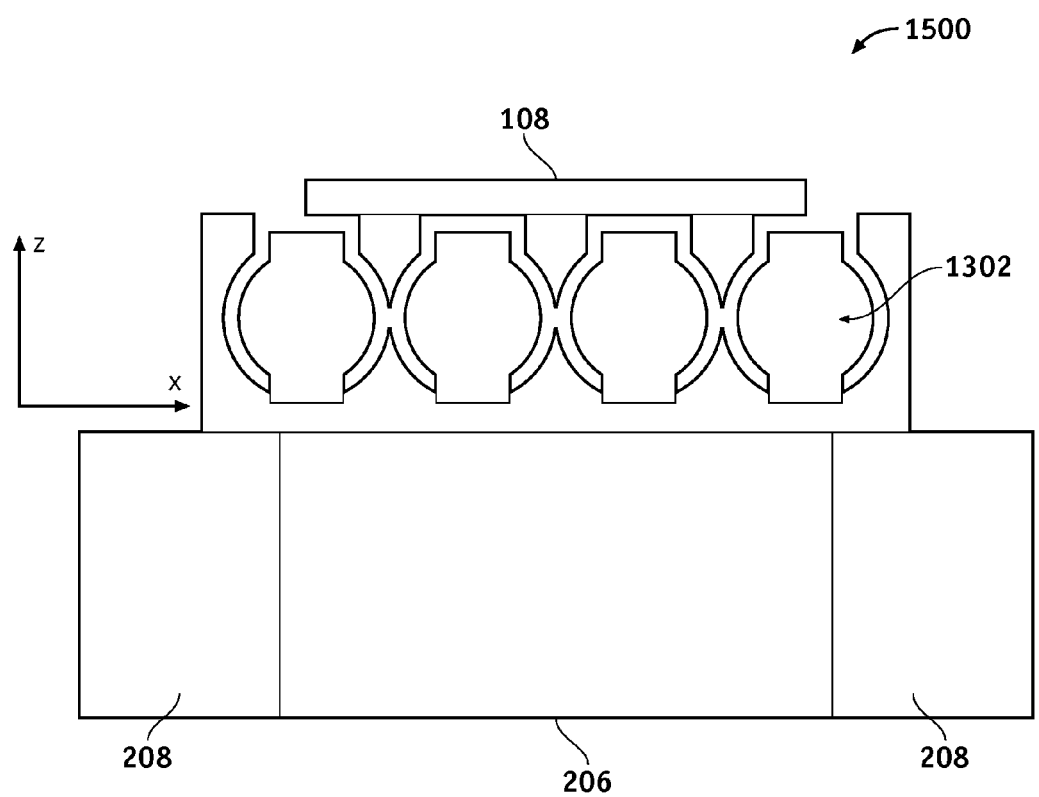
FIG. 15 is an illustration of an exemplary multifunction magnetically actuated photonic crystal sensor according to an embodiment of the disclosure.

FIG. 15 is an illustration of an exemplary multifunction magnetically actuated photonic crystal sensor 1500 according to an embodiment of the disclosure. The multifunction magnetically actuated photonic crystal sensor 1500 is operable to be sensitive to two or more measurands, where a measurands is a particular quantity subject to measurement. The multifunction magnetically actuated photonic crystal sensor 1500 is interrogated by many wavelengths (e.g., $\lambda_1, \lambda_2, \lambda_3, \ldots$) as these wavelengths are measurands. The reflectivities on the fiber 206 at the different wavelengths (i.e., $\lambda_1, \lambda_2, \lambda_3, \ldots$) depend differently on the measurands, so the measured reflectivities at a chosen wavelength ($R_1, R_2, R_3, \ldots$) allows calculation of the measurands ($S_1, S_2, S_3, \ldots$). For example, for multiaxis magnetic field sensing, two measurands $S_1$ and $S_2$ may measure the motion in direction X and direction Z respectively.

Figure 16:
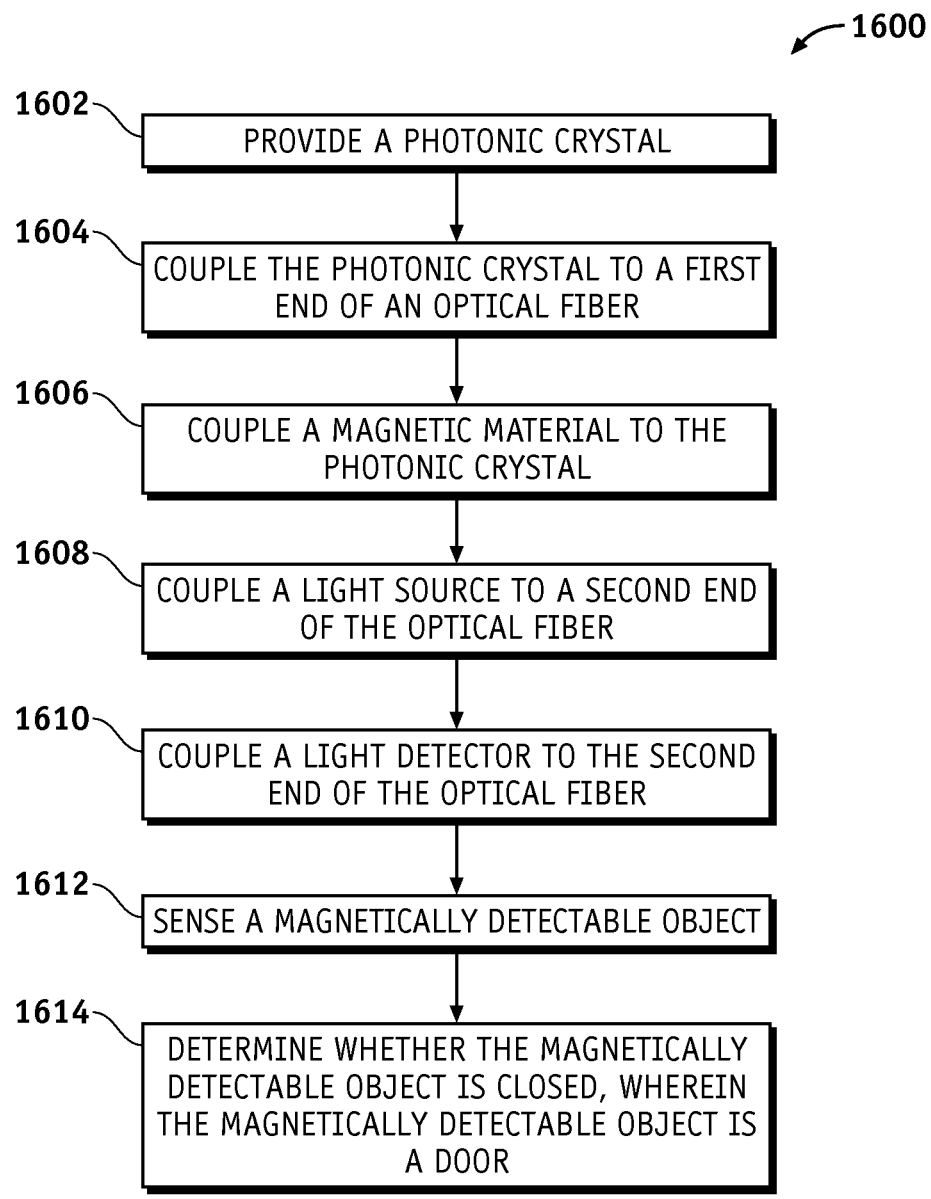
FIG. 16 is an illustration of an exemplary flow chart showing a process for providing a magnetically actuated photonic crystal sensor according to an embodiment of the disclosure.

FIG. 16 is an illustration of an exemplary flow chart showing a process for providing the magnetically actuated photonic crystal sensor 102 according to an embodiment of the disclosure. The various tasks performed in connection with process 1600 may be performed mechanically, by software, hardware, firmware, or any combination thereof. For illustrative purposes, the following description of process 1600 may refer to elements mentioned above in connection with FIGS. 1-15. In practical embodiments, portions of the process 1600 may be performed by different elements of the magnetically actuated photonic crystal sensor 102 such as the magnetic material 104, the photonic crystal 106, the optical fiber 108, the at least one coherent light source 116, and the at least one light detector 118. Process 1600 may have functions, material, and structures that are similar to the embodiments shown in FIGS. 1-15. Therefore common features, functions, and elements may not be redundantly described here.

Process 1600 may begin by providing a photonic crystal 106/202 (task 1602).

Process 1600 may then continue by coupling the photonic crystal 106/202 to the first end 112/206 of the optical fiber 108/204 (task 1604).

Process 1600 may then continue by coupling a magnetic material 104 to the photonic crystal 106/202 (task 1606).

Process 1600 may then continue by coupling the at least one light source 116 to the second end 114 of the optical fiber 108/204 (task 1608). In this manner, the optical fiber 108/204 transmits light waves from the at least one light source 116 to the photonic crystal 106/202.

Process 1600 may then continue by coupling the at least one light detector 118 to the second end 114 of the optical fiber 108/204 (task 1610). In this manner, the optical fiber 108/204 transmits light waves from the photonic crystal 106/202 to the at least one light detector 118, which detects the light waves.

Process 1600 may then continue by sensing a magnetically detectable object 110 (task 1612), such as but without limitation, an aircraft door, a train door, an automobile door, a house door, a gate, a vault, and the like.

Process 1600 may then continue by determining whether the magnetically detectable object 110 (e.g., a door) is closed (task 1614). For example, the magnetically actuated photonic crystal sensor 102 senses force changes due to presence or absence of a door in a proximity thereof and determines whether the door is closed or not based on a predetermined measurement. When the door is closed, the proximity of the magnetic material paced on the door substantially changes the forces on the magnetically actuated photonic crystal sensor 102/1500. This in turn changes a reflectivity at a monitoring wavelength, so that a measured reflectivity less than a chosen threshold shows that the door is open, and a measured reflectivity greater than a chosen threshold shows that the door is closed. In an alternative embodiment, a measured reflectivity less than a chosen threshold shows that the door is closed, and a measured reflectivity greater than a chosen threshold shows that the door is open.

Figure 17:
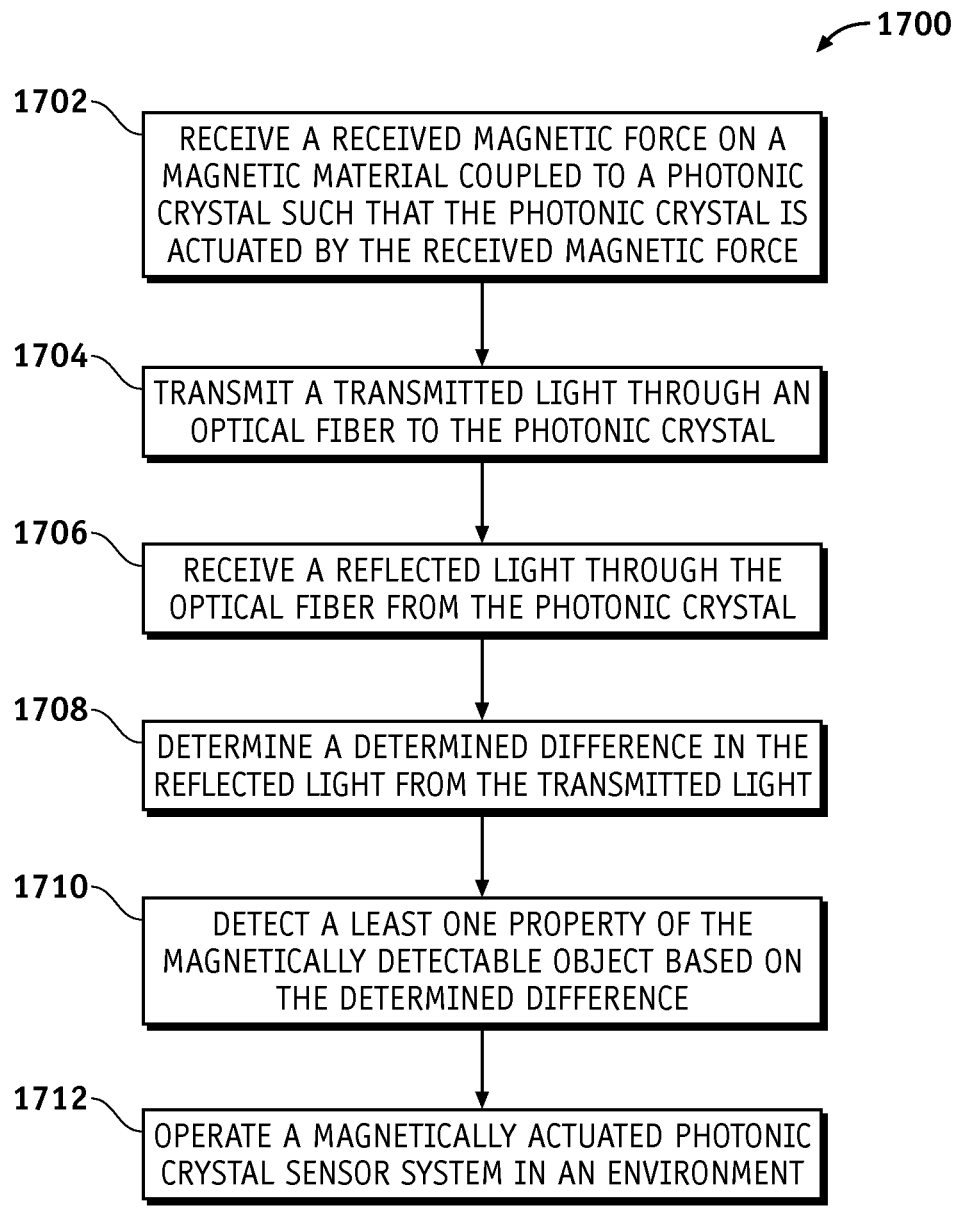
FIG. 17 is an illustration of an exemplary flow chart showing a process for using a magnetically actuated photonic crystal sensor system according to an embodiment of the disclosure.

FIG. 17 is an illustration of an exemplary flow chart showing a process for using the magnetically actuated photonic crystal sensor system 100 according to an embodiment of the disclosure. The various tasks performed in connection with process 1700 may be performed mechanically, by software, hardware, firmware, or any combination thereof. For illustrative purposes, the following description of process 1700 may refer to elements mentioned above in connection with FIGS. 1-15. In practical embodiments, portions of the process 1700 may be performed by different elements of the magnetically actuated photonic crystal sensor system 100 such as the magnetic material 104, the photonic crystal 106, the optical fiber 108, the at least one coherent light source 116, the at least one light detector 118, and the magnetically detectable object 110. Process 1700 may have functions, material, and structures that are similar to the embodiments shown in FIGS. 1-15. Therefore common features, functions, and elements may not be redundantly described here.

Process 1700 may begin by receiving a received magnetic force on a magnetic material coupled to the photonic crystal 106 such that the photonic crystal is actuated by the received magnetic force (task 1702). The magnetic force may be received from the magnetically detectable object 110.

Process 1700 may then continue by transmitting a transmitted light through the optical fiber 108 to the photonic crystal 106 (task 1704).

Process 1700 may then continue by receiving a reflected light through the optical fiber 108 from the photonic crystal 106 (task 1706). As explained above, the photonic crystal 106 may modify the reflected light based on the received magnetic force, for example but without limitation, based on interferometry, and the like, in the photonic crystal 106.

Process 1700 may then continue by determining a determined difference in the reflected light from the transmitted light (task 1708). The determined difference may be obtained, for example but without limitation, based on interferometry of the reflected light and the transmitted light, and the like.

Process 1700 may then continue by detecting at least one property of the magnetically detectable object based on the determined difference (task 1710). As explained above, the at least one property may comprise, for example but without limitation, speed, acceleration, deceleration, vibration, displacement, immobility and the like. For example, the displacement may be measured based on a measured reflectivity. In this manner, measured reflectivity less than a chosen displacement threshold may indicate a door is open (or closed), and a measured reflectivity greater than the chosen displacement threshold may indicate that the door is closed (or open).

Process 1700 may then continue by operating the magnetically actuated photonic crystal sensor system in an environment (task 1712). The environment may comprise, for example but without limitation, contamination, obscurants, obstructions, debris, potential sources of physical deformation, and a non-contaminated environment.

In this way, various embodiments of the disclosure provide a method for providing a magnetically actuated photonic crystal sensor. Embodiments provide means for sensing force changes on a magnetic material that actuate a photonic crystal without any physical contact thereon. Because magnetic actuation requires no physical contact, the magnetically actuated photonic crystal sensor system is operable in an environment comprising obscurants, obstructions, debris, and/or potential sources of physical deformation as well as in contamination free environments.

While at least one example embodiment has been presented in the foregoing detailed description, it should be appreciated that a vast number of variations exist. It should also be appreciated that the example embodiment or embodiments described herein are not intended to limit the scope, applicability, or configuration of the subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The above description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although FIGS. 1-15 depict example arrangements of elements, additional intervening elements, devices, features, or components may be present in an embodiment of the disclosure.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:

1. A method for using a magnetically actuated photonic crystal sensor system, the method comprising:
   receiving a received magnetic force on a magnetic material coupled to a photonic crystal such that the photonic crystal is actuated by the received magnetic force;
   transmitting a transmitted light through an optical fiber to the photonic crystal;
   receiving a reflected light through the optical fiber from the photonic crystal; and
   determining a determined difference in the reflected light from the transmitted light.

2. The method of claim 1, wherein the received magnetic force is received from a magnetically detectable object.

3. The method of claim 2, further comprising detecting at least one property of the magnetically detectable object based on the determined difference.

4. The method of claim 3, wherein the at least one property comprises at least one of the group consisting of: speed, acceleration, deceleration, vibration, displacement, and immobility.

5. The method of claim 2, wherein the magnetically detectable object is not in physical contact with the magnetic material.

6. The method of claim 1, further comprising operating the magnetically actuated photonic crystal sensor system in an environment comprising at least one of the group consisting of: contamination, obscurants, obstructions, debris, potential sources of physical deformation, and no contamination.

7. The method of claim 1, wherein the photonic crystal is mechanically coupled to the magnetic material.

8. The method of claim 1, wherein the magnetic material is mounted on the photonic crystal.

9. The method of claim 1, wherein the magnetic material is coupled to a side of the photonic crystal.

* * * * *